US010584698B2

(12) United States Patent
Haddad et al.

(10) Patent No.: US 10,584,698 B2
(45) Date of Patent: Mar. 10, 2020

(54) PUMP ASSEMBLY HEALTH ASSESSMENT

(71) Applicant: Schlumberger Technology Corporation, Sugar Land, TX (US)

(72) Inventors: Gilbert Haddad, Houston, TX (US); Nicholas Dane Williard, Houston, TX (US); Neil Holger White Eklund, Menlo Park, CA (US); Jean-Marc Follini, Houston, TX (US); Rakesh Jaggi, Houston, TX (US); Shaun Alan Wolski, Houston, TX (US); Christian Abel Chavero Perez, Houston, TX (US); Wenyu Zhao, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 267 days.

(21) Appl. No.: 15/092,694

(22) Filed: Apr. 7, 2016

(65) Prior Publication Data

US 2017/0292513 A1    Oct. 12, 2017

(51) Int. Cl.
| | |
|---|---|
| *F04B 51/00* | (2006.01) |
| *F04B 49/06* | (2006.01) |
| *F04B 1/04* | (2020.01) |
| *F04B 43/02* | (2006.01) |
| *E21B 41/00* | (2006.01) |

(Continued)

(52) U.S. Cl.
CPC .......... *F04B 51/00* (2013.01); *E21B 41/0092* (2013.01); *E21B 47/00* (2013.01); *F04B 1/04* (2013.01); *F04B 43/02* (2013.01); *F04B 43/026* (2013.01); *F04B 49/065* (2013.01);

(Continued)

(58) Field of Classification Search
None
See application file for complete search history.

(56) References Cited

U.S. PATENT DOCUMENTS

| 6,257,332 B1 | 7/2001 | Vidrine et al. |
|---|---|---|
| 6,405,140 B1 | 6/2002 | Chen et al. |

(Continued)

FOREIGN PATENT DOCUMENTS

| WO | 2010091239 A2 | 8/2010 |
|---|---|---|
| WO | 2010091239 A4 | 3/2011 |

(Continued)

OTHER PUBLICATIONS

Saxena et al., "Damage Propagation Modeling for Aircraft Engine Run-to-Failure Simulation", Prognostics and Health Management, 2008. PHM 2008. International Conference, 9 pages.

(Continued)

*Primary Examiner* — Reema Patel
*Assistant Examiner* — Steven M Christopher
(74) *Attorney, Agent, or Firm* — Cathy Hewitt

(57) ABSTRACT

Method and apparatus for assessing health of fracturing fluid pump assemblies and other wellsite equipment. For example, predicted data indicative of a first operational parameter of a pump assembly is generated utilizing: a model relating the first operational parameter to each of a plurality of second operational parameters of the pump assembly; and real-time data indicative of each of the second operational parameters. Health of the pump assembly is then assessed based on: the predicted data indicative of the first operational parameter; and real-time data indicative of the first operational parameter.

20 Claims, 5 Drawing Sheets

(51) Int. Cl.
    *E21B 47/00*     (2012.01)
    *F04B 53/10*     (2006.01)
    *F04B 53/14*     (2006.01)
    *G06F 17/50*     (2006.01)

(52) U.S. Cl.
    CPC .............. *F04B 53/10* (2013.01); *F04B 53/14* (2013.01); *G06F 17/5009* (2013.01)

(56) References Cited

U.S. PATENT DOCUMENTS

| | | |
|---|---|---|
| 6,411,908 B1 | 6/2002 | Talbott |
| 6,442,542 B1 | 8/2002 | Ramani et al. |
| 6,522,978 B1 | 2/2003 | Chen et al. |
| 7,395,188 B1 | 7/2008 | Goebel et al. |
| 7,509,235 B2 | 3/2009 | Bonissone et al. |
| 8,087,477 B2 | 1/2012 | Sullivan et al. |
| 8,204,697 B2 | 6/2012 | Garvey et al. |
| 2007/0140869 A1 | 6/2007 | St. Michel et al. |
| 2008/0006089 A1 | 1/2008 | Adnan et al. |
| 2009/0299654 A1* | 12/2009 | Garvey ................ E21B 41/00 702/34 |
| 2012/0084065 A1 | 4/2012 | Zhan et al. |
| 2013/0233165 A1 | 9/2013 | Matzner et al. |
| 2013/0290064 A1* | 10/2013 | Altamirano ...... G06Q 10/06316 705/7.26 |
| 2014/0122047 A1 | 5/2014 | Saldivar et al. |

FOREIGN PATENT DOCUMENTS

| | | |
|---|---|---|
| WO | 2012001653 A2 | 1/2012 |
| WO | 2014066599 A1 | 5/2014 |
| WO | 2016014476 A1 | 1/2016 |

OTHER PUBLICATIONS

International Search Report and Written Opinion issued in International Patent Appl. No. PCT/US2017/024206 dated Jul. 6, 2017; 18 pages.

* cited by examiner

PUMP ASSEMBLY HEALTH ASSESSMENT

BACKGROUND OF THE DISCLOSURE

High-volume, high-pressure pumps are utilized at wellsites for a variety of pumping operations. Such operations may include drilling, cementing, acidizing, water jet cutting, hydraulic fracturing, and other wellsite operations. In some pumping operations, several pumps may be fluidly connected in parallel to a well via a manifold and various conduits. For example, the manifold distributes low-pressure fluid to the pumps, which return high-pressure fluid to the manifold for combination and injection into the well. The manifold may have a large physical size and weight to satisfy intended fluid flow rates and operating pressures generated by the pumps. For example, the manifold may convey fluid at a pressure exceeding about 15,000 pounds per square inch (PSI) and a fluid flow rate exceeding about 1,500 gallons per minute (GPM).

The success of the pumping operations may be related to many factors, including operational efficiency, failure rates, and safety of the pumps. However, high fluid pressures, flow rates, vibrations, and other factors cause mechanical fatigue, wear, and other damage to the pumps, and/or otherwise affect their operational efficiency. Pump mechanical failure due to mechanical fatigue, wear, and other damage is a leading cause of non-productive time on pumping operations. Moreover, the failure rate in pumps is so high that a comparatively large number of pumps are brought to the job site to ensure that enough are available in the event of a failure, resulting in under-utilization of assets.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces a method that includes operating a processing system. The processing system includes a processor and a memory including computer program code. Operating the processing system includes generating predicted data indicative of a first operational parameter of a pump assembly. Generating the predicted data utilizes (1) a model relating the first operational parameter to second operational parameters of the pump assembly, and (2) real-time data indicative of each of the second operational parameters. Operating the processing system also includes assessing health of the pump assembly based on (1) the predicted data indicative of the first operational parameter, and (2) real-time data indicative of the first operational parameter.

The present disclosure also introduces a method that includes operating a processing system. The processing system includes a processor and a memory including computer program code. Operating the processing system includes, with respect to each of multiple pump assemblies, generating predicted data indicative of a first operational parameter of that pump assembly. Generating the predicted data utilizes (1) a single model applicable to each of the pump assemblies and relating the first operational parameter to each of second operational parameters of the pump assemblies, and (2) real-time data obtained from, and indicative of each of the second operational parameters of, that pump assembly. Operating the processing system also includes, with respect to each of the pump assemblies, assessing health of that pump assembly based on (1) the predicted data generated with respect to that pump assembly, and (2) real-time data obtained from, and indicative of the first operational parameter of, that pump assembly.

The present disclosure also introduces an apparatus that includes a processing system. The processing system includes a processor and a memory including computer program code. The processing system is operable to generate predicted data indicative of a first operational parameter of a pump assembly. The processing system is operable to generate the predicted data utilizing (1) a model implemented in the computer program code and relating the first operational parameter to each of second operational parameters of the pump assembly, and (2) real-time data indicative of each of the second operational parameters. The processing system is also operable to assess health of the pump assembly based on (1) the predicted data indicative of the first operational parameter, and (2) real-time data indicative of the first operational parameter.

The present disclosure also introduces a method that includes operating a processing system that includes a processor and a memory including computer program code. Operating the processing system includes selecting multiple degradation-correlating parameters available for a pump assembly, utilizing the degradation-correlating parameters when defining a standard state of operation of the pump assembly, acquiring standard state data pertaining to the pump assembly, and utilizing the standard state data to assess health of the pump assembly.

These and additional aspects of the present disclosure are set forth in the description that follows, and/or may be learned by a person having ordinary skill in the art by reading the materials herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
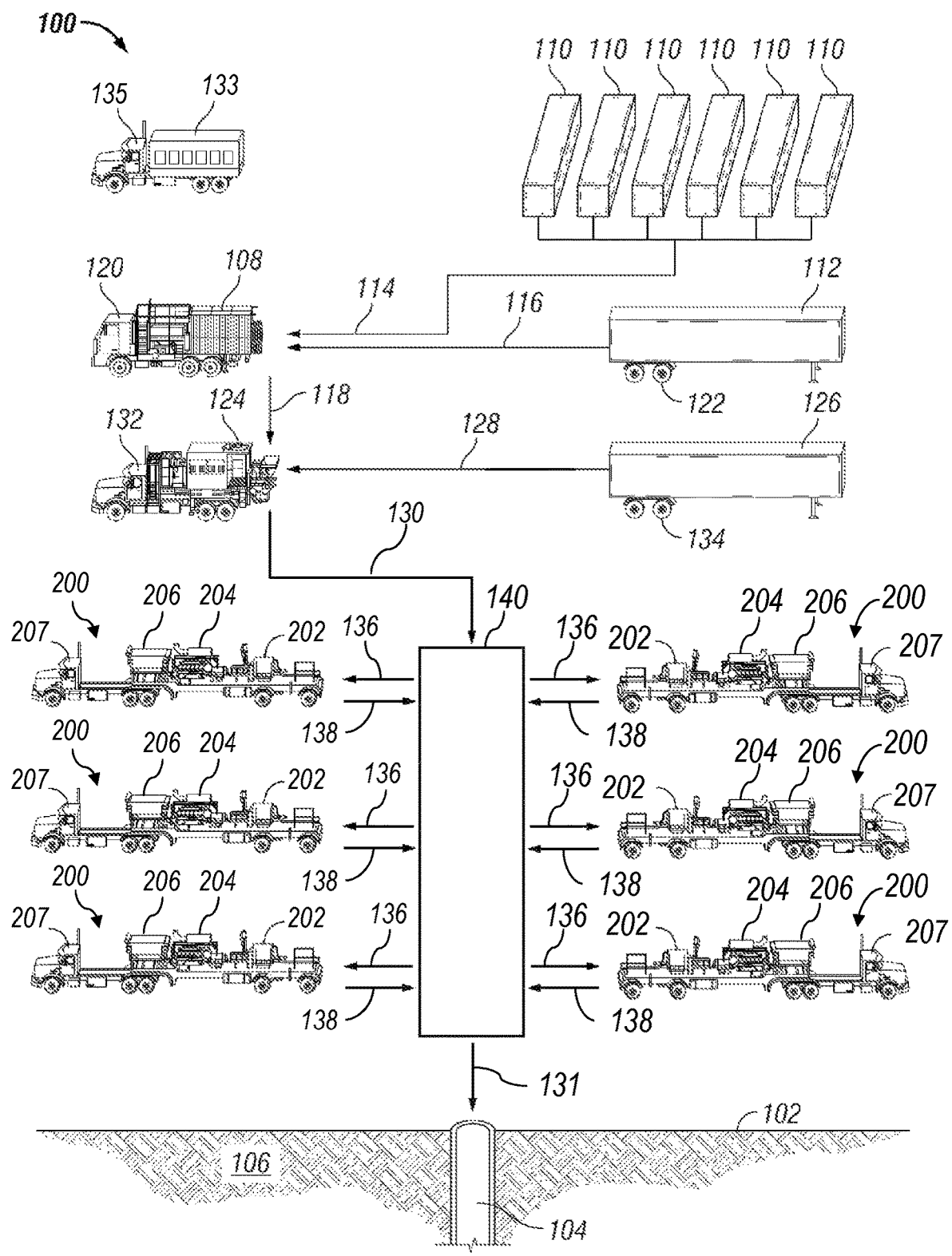
FIG. 1 is a schematic view of an example implementation of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for simplicity and clarity, and does not in itself dictate a relationship between the various embodiments and/or configurations discussed.

FIG. 1 is a schematic view of at least a portion of an example wellsite system 100 according to one or more aspects of the present disclosure. The figure depicts a wellsite surface 102 adjacent to a wellbore 104 and a partial sectional view of the subterranean formation 106 penetrated by the wellbore 104 below the wellsite surface 102. The wellsite system 100 may comprise a mixer 108 fluidly connected with one or more tanks 110 and a container 112. The container 112 may contain a first material and the tanks 110 may contain a liquid. The first material may be or comprise a hydratable material or gelling agent, such as guar, polymers, synthetic polymers, galactomannan, polysaccharides, cellulose, and/or clay, among other examples, and the liquid may be or comprise an aqueous fluid, which may comprise water or an aqueous solution comprising water, among other examples. The mixer 108 may be operable to receive the first material and the liquid via two or more conduits 114, 116, and mix or otherwise combine the first material and the liquid to form a base fluid, which may be or comprise that which is known in the art as a gel. The mixer 108 may then discharge the base fluid via one or more conduits 118.

The wellsite system 100 may further comprise a mixer 124 fluidly connected with the mixer 108 and a container 126. The container 126 may contain a second material that may be substantially different than the first material. For example, the second material may be or comprise a proppant material, such as sand, sand-like particles, silica, quartz, and/or propping agents, among other examples. The mixer 124 may be operable to receive the base fluid from the mixer 108 via one or more conduits 118, and the second material from the container 126 via one or more conduits 128, and mix or otherwise combine the base fluid and the second material to form a mixture, which may be or comprise that which is known in the art as a fracturing fluid. The mixer 124 may then discharge the mixture via one or more conduits 130. For clarity, the mixture discharged from the mixer 124 via the one or more conduits 130 will be referred to hereinafter simply as "a fluid."

The fluid may be communicated from the mixer 124 via the one or more conduits 130 to a manifold unit 140, which may be or comprise what known in the art as a manifold trailer or missile. The manifold unit 140 is operable to receive the fluid via the one or more conduits 130 and distribute the fluid to the pump units 200 via corresponding conduits 136. The pump units 200 pressurize the fluid received via the corresponding conduits 136 and return the high-pressure fluid to the manifold unit 140 via corresponding conduits 138. The high-pressure fluid may then be injected into the wellbore 104, such as via one or more conduits 131, although perhaps through various additional conduits, valves, and/or other hydraulic circuitry fluidly connected between the manifold unit 140 and the wellbore 104.

Figure 2:
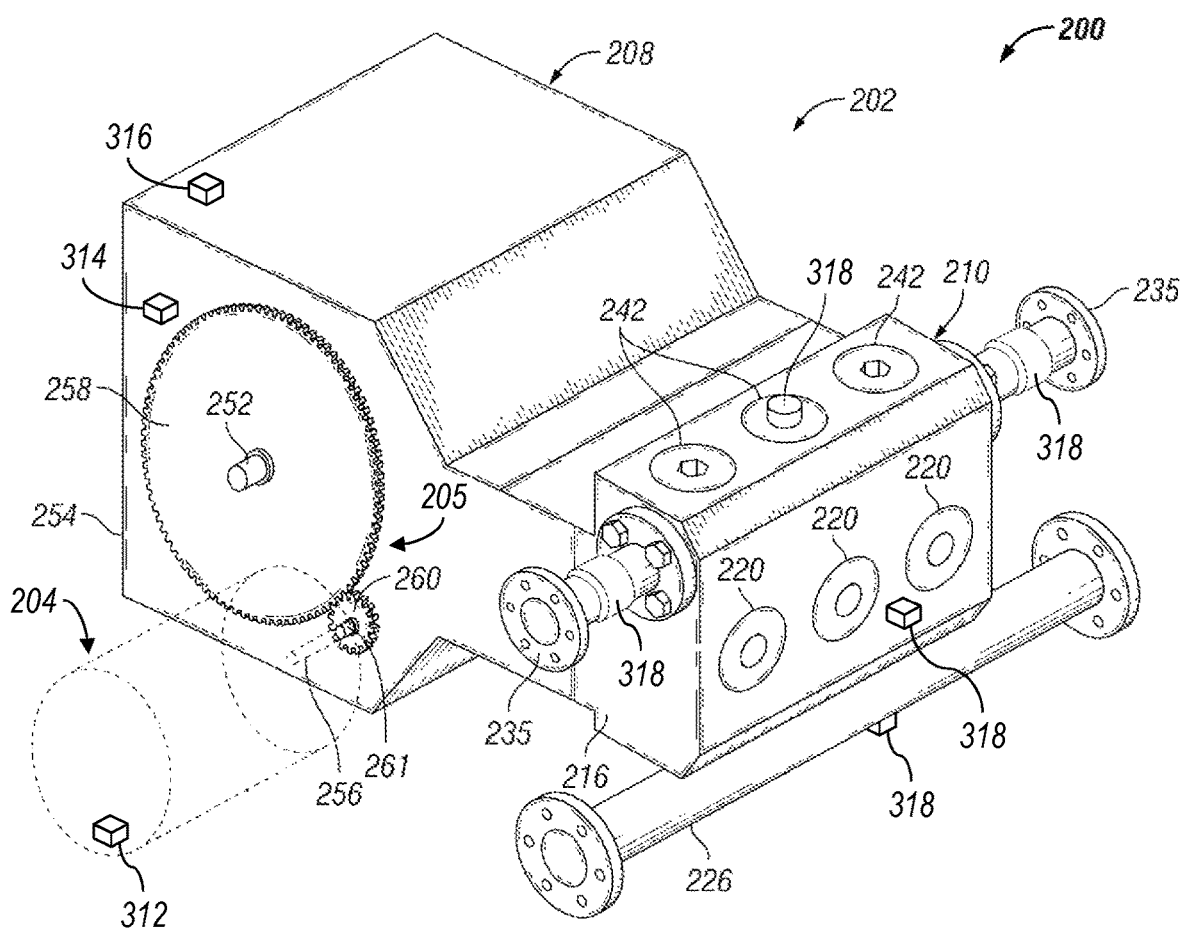
FIG. 2 is a perspective view of an example implementation of a portion of the apparatus shown in FIG. 1 according to one or more aspects of the present disclosure.
Figure 3:
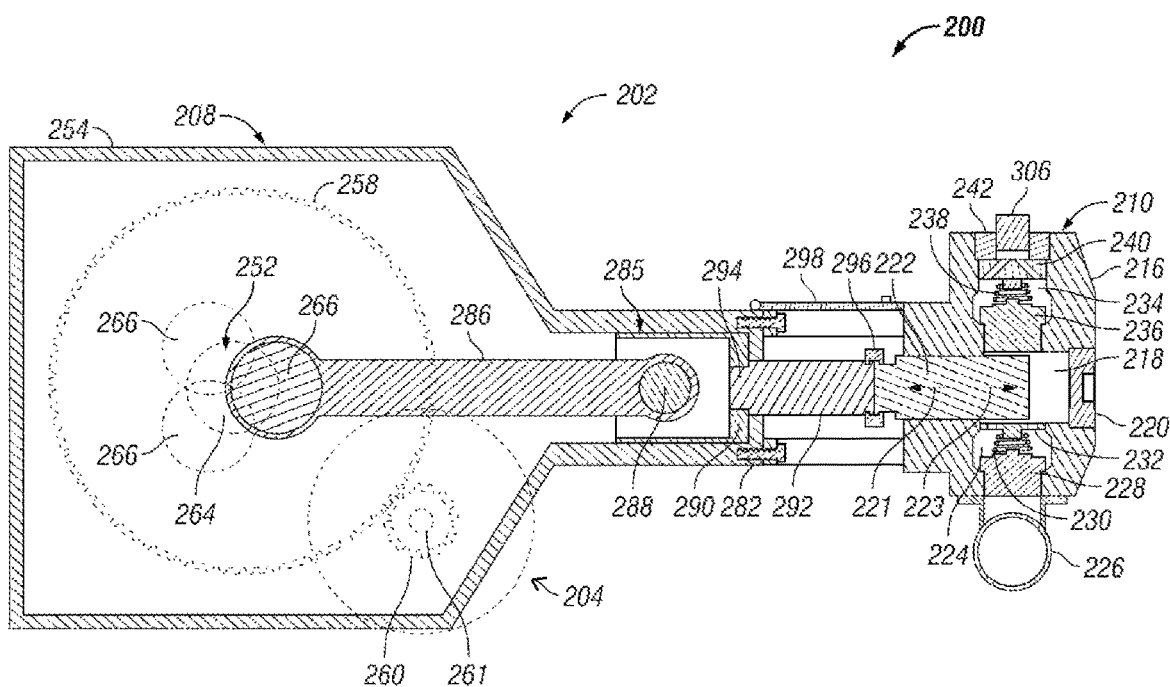
FIG. 3 is a sectional view of the apparatus shown in FIG. 2.

Each of the pump units 200 may comprise a plurality of components such as a pump 202, a prime mover 204, and a heat exchanger 206. The pumps 202 may be implemented as reciprocating pumps, each comprising fluid pressurizing chambers and fluid displacing members, such as shown in FIGS. 2 and 3. Depending on the size of each pump 202 and the operating speed of the corresponding prime mover 204, each pump 202 may be operable to conduct the high-pressure fluid into the manifold unit 140 at a flow rate ranging between about 100 GPM and about 1,500 GPM, although other flow rates are also within the scope of the present disclosure. Although the pump fleet of the wellsite system 100 is shown comprising six pump units 200, pump fleets comprising other numbers of pump units 200 are also within the scope of the present disclosure.

The wellsite system 100 may also comprise a control/power center 133, such as may be operable to provide control and/or centralized electric power distribution to one or more portions of the wellsite system 100. The control/power center 133 may be operable to monitor and control at least a portion of the wellsite system 100 during pumping operations. For example, the control/power center 133 may be operable to monitor and control one or more portions of the mixer 108, the mixer 124, the pump units 200, the manifold unit 140, and other pumps, conveyors, and/or other material transfer devices (not shown). The control/power center 133 may comprise an engine-generator set (not shown), such as a gas turbine generator, an internal combustion engine generator, and/or other sources of electric power. Electric power and/or control signals may be communicated between the control/power center 133 and other wellsite equipment wirelessly and/or via electric conductors (not shown).

The mixers 108, 124, the containers 110, 112, 126, the pump units 200, and the control/power center 133 may each be disposed on corresponding trucks, trailers, and/or other mobile carriers 120, 132, 122, 134, 207, 135, respectively, such as may permit their transportation to the wellsite surface 102. The manifold unit 140 may also be mounted on one or more trucks, trailers, and/or other mobile carriers (not shown), such as may permit its transportation to the wellsite surface 102. However, one of more of the mixers 108, 124, the containers 110, 112, 126, the pump units 200, the control/power center 133, and/or the manifold unit 140 may be skidded or otherwise stationary, and/or may be temporarily or permanently installed at the wellsite surface 102.

FIG. 1 depicts the wellsite system 100 as being operable to form fluids and/or mixtures that may be pressurized and individually or collectively injected into the wellbore 104 during hydraulic fracturing of the subterranean formation 106. However, it is to be understood that the wellsite system 100 may be operable to mix and/or produce other mixtures and/or fluids that may be pressurized by the pump units 200 and individually or collectively injected into the wellbore 104 during other oilfield operations, such as drilling, cementing, acidizing, chemical injecting, and/or water jet cutting operations, among other examples.

FIG. 2 is a perspective view of a portion of an example implementation of an instance of the pump assemblies 200 shown in FIG. 1 according to one or more aspects of the present disclosure. FIG. 3 is a side sectional view of a portion of the pump assembly 200 shown in FIG. 2. The following description refers to FIGS. 1-3, collectively.

As described above, the pump unit 200 comprises the pump 202 operatively coupled with and actuated by the prime mover 204. The pump 202 comprises a power end 208 and a fluid end 210. The fluid end 210 may comprise a pump housing 216 having a plurality of fluid chambers 218. One end of each fluid chamber 218 may be plugged by a cover plate 220, such as may be threadedly engaged with the pump housing 216, while the opposite end of each fluid chamber 218 may contain a reciprocating member 222 slidably disposed therein and operable to displace the fluid within the corresponding fluid chamber 218. Although the reciprocating member 222 is depicted as a plunger, the reciprocating member 222 may also be implemented as a piston, diaphragm, or another reciprocating fluid displacing member.

Each fluid chamber 218 is fluidly connected with a corresponding one of a plurality of fluid inlet cavities 224 each adapted for communicating fluid from a fluid inlet conduit 226 into a corresponding fluid chamber 218. The fluid inlet conduit 226 is in fluid communication with a corresponding conduit 136 for receiving low-pressure fluid from the manifold unit 140. Each fluid inlet cavity 224 contains an inlet valve 228 operable to control fluid flow from the fluid inlet conduit 226 into the fluid chamber 218. Each inlet valve 228 may be biased toward a closed-flow position by a spring or other biasing member 230, which may be held in place by an inlet valve stop 232. Each inlet valve 228 may be actuated to an open-flow position by a selected or predetermined differential pressure between the corresponding fluid inlet cavity 224 and the fluid inlet conduit 226.

Each fluid chamber 218 is also fluidly connected with a fluid outlet cavity 234 extending through the pump housing 216 transverse to the reciprocating members 222. The fluid outlet cavity 234 is adapted for communicating pressurized fluid from each fluid chamber 218 into one or more fluid outlet conduits 235 fluidly connected at one or both ends of the fluid outlet cavity 234. The fluid outlet conduits 235 are in fluid communication with the manifold unit 140 via the conduits 138. The fluid end 210 also contains a plurality of outlet valves 236 each operable to control fluid flow from a corresponding fluid chamber 218 into the fluid outlet cavity 234. Each outlet valve 236 may be biased toward a closed-flow position by a spring or other biasing member 238, which may be held in place by an outlet valve stop 240. Each outlet valve 236 may be actuated to an open-flow position by a selected or predetermined differential pressure between the corresponding fluid chamber 218 and the fluid outlet cavity 234. The fluid outlet cavity 234 may be plugged by cover plates 242, such as may be threadedly engaged with the pump housing 216.

During pumping operations, portions of the power end 208 rotate in a manner that generates a reciprocating linear motion to move the reciprocating members 222 longitudinally within the corresponding fluid chambers 218, thereby alternatingly drawing and displacing the fluid within the fluid chambers 218. With regard to each reciprocating member 222, as the reciprocating member 222 moves out of the fluid chamber 218, as indicated by arrow 221, the pressure of the fluid inside the corresponding fluid chamber 218 decreases, thus creating a differential pressure across the corresponding fluid inlet valve 228. The pressure differential operates to compress the biasing member 230, thus actuating the fluid inlet valve 228 to an open-flow position to permit the fluid from the fluid inlet conduit 226 to enter the corresponding fluid inlet cavity 224. The fluid then enters the fluid chamber 218 as the reciprocating member 222 continues to move longitudinally out of the fluid chamber 218 until the pressure difference between the fluid inside the fluid chamber 218 and the fluid within the fluid inlet conduit 226 is low enough to permit the biasing member 230 to actuate the fluid inlet valve 228 to the closed-flow position. As the reciprocating member 222 begins to move longitudinally back into the fluid chamber 218, as indicated by arrow 223, the pressure of the fluid inside of fluid chamber 218 begins to increase. The fluid pressure inside the fluid chamber 218 continues to increase as the reciprocating member 222 continues to move into the fluid chamber 218 until the pressure of the fluid inside the fluid chamber 218 is high enough to overcome the pressure of the fluid inside the fluid outlet cavity 234 and compress the biasing member 238, thus actuating the fluid outlet valve 236 to the open-flow position and permitting the pressurized fluid to move into the fluid outlet cavity 234 and the fluid outlet conduit 235. Thereafter, the fluid may be communicated to the manifold unit 140 via the corresponding fluid conduit 138.

The fluid flow rate generated by the pump unit 200 may depend on the physical size of the reciprocating members 222 and fluid chambers 218, as well as the pump operating speed, which may be defined by the speed or rate at which the reciprocating members 222 cycle or move within the fluid chambers 218. The speed or rate at which the reciprocating members 222 move may be related to the rotational speed of the power end 208 and/or the prime mover 204. Accordingly, controlling the rotational speed of the power end 208 and/or the prime mover may control the fluid flow rate generated by the pump unit 200.

The prime mover 204 may be operatively coupled with a drive shaft 252 of the power end 208. The drive shaft 252 may be enclosed and maintained in position by a power end housing 254, such that the prime mover 204 is operable to drive or otherwise rotate the drive shaft 252. The prime mover 204 may comprise a rotatable output shaft 256 operatively connected with the drive shaft 252 by a gear train or other transmission 205. For example, the transmission 205 may comprise at least one spur gear 258 coupled with the drive shaft 252 and at least one pinion gear 260 coupled with a support shaft 261. The output shaft 256 and the support shaft 261 are coupled in a manner facilitating the transfer of torque from the prime mover 204 to the support shaft 261, the pinion gear 260, the spur gear 258, and the drive shaft 252. For clarity, FIGS. 2 and 3 depict the transmission as comprising a single spur gear 258 engaging a single pinion gear 260. However, it is to be understood that the transmission may comprise two or more sets of gears, such as may permit the transmission to be shifted between different gear configurations to control the operating speed of the drive shaft 252 and, thus, the pumping rate of the fluid end 210. To prevent relative rotation between the power end housing 254 and the prime mover 204, the power end housing 254 and prime mover 204 may be fixedly coupled together or to a common base, such as a trailer of the mobile carrier 148. The prime mover 204 may comprise an engine, such as a gasoline engine or a diesel engine, an electric motor, such as a synchronous or asynchronous electric motor, including a synchronous permanent magnet motor, a hydraulic motor, or another prime mover operable to rotate the drive shaft 252.

The drive shaft 252 may be implemented as a crankshaft comprising a plurality of axial journals 264 and offset journals 266. The axial journals 264 may extend along a central axis of rotation of the drive shaft 252, while the offset journals 266 may be offset from the central axis of rotation by a selected or predetermined distance and spaced 120 degrees apart with respect to the axial journals 264. The drive shaft 252 may be supported in position within the power end 208 by the power end housing 254, wherein two of the axial journals 264 may extend through opposing openings in the power end housing 254.

The power end 208 and the fluid end 210 may be coupled or otherwise connected together. For example, the pump housing 216 may be fastened with the power end housing 254 by a plurality of threaded fasteners 282. The pump 202 may further comprise an access door 298, which may facilitate access to portions of the pump 202 located between the power end 208 and the fluid end 210, such as during assembly and/or maintenance of the pump 202.

To transform and transmit the rotational motion of the drive shaft 252 to a reciprocating linear motion of the reciprocating members 222, a plurality of crosshead mechanisms 285 may be utilized. For example, each crosshead mechanism 285 may comprise a connecting rod 286 pivotally coupled with a corresponding offset journal 266 at one end and with a pin 288 of a crosshead 290 at an opposing end. During pumping operations, walls and/or interior portions of the power end housing 254 may guide each crosshead 290, such as may reduce or eliminate lateral motion of each crosshead 290. Each crosshead mechanism 285 may further comprise a piston rod 292 coupling the crosshead 290 with the reciprocating member 222. The piston rod 292 may be coupled with the crosshead 290 via a threaded connection 294 and with the reciprocating member 222 via a flexible connection 296.

Although FIGS. 2 and 3 depict the pump unit 200 as comprising a triplex reciprocating pump 202, which has three fluid chambers 218 and three reciprocating members 222, other implementations within the scope of the present disclosure may include the pump 202 as a quintuplex reciprocating pump having five fluid chambers 218 and five reciprocating members 222, or a pump having other numbers of fluid chambers 218 and reciprocating members 222. It is further noted that the pump 202 described above and shown in FIGS. 2 and 3 is merely an example, and that other pumps, such as diaphragm pumps, gear pumps, external circumferential pumps, internal circumferential pumps, lobe pumps, and other positive displacement pumps, are also within the scope of the present disclosure.

Various sensors are disposed in association with each pump assembly 200. The sensors are operable to generate electrical signals containing real-time data indicative of various operational parameters related to operation of the pump 200. For example, the pump assembly 200 may comprise one or more sensors 312 operable to generate real-time data related to operating voltage, load percentage, boost pressure, fuel pressure, fuel flow rate, oil pressure, coolant temperature, and/or other operational parameters of the prime mover 204. The pump assembly 200 may also or instead comprise one or more sensors 314 operable to generate real-time data related to lockup pressure, converter (not shown) temperature, sump (not shown) temperature, main oil pressure, filter (not shown) in-pressure and/or out-pressure, and/or other operational parameters of the transmission 205. The pump assembly 200 may also or instead comprise one or more sensors 316 operable to generate real-time data related to oil pressure, oil temperature, pumping rate, and/or other operational parameters of the power end 208. The pump assembly 200 may also or instead comprise one or more sensors 318 operable to generate real-time data related to fluid input (suction) pressure and/or flow rate, fluid output (discharge) pressure and/or flow rate, and/or other operational parameters of the fluid end 210. For example, one or more of the sensors 318 may be fluidly or otherwise coupled along the fluid input conduit 226 or the fluid outlet conduits 235, or may be coupled to and perhaps extend through one or more of the cover plates 242 or other portions of the housing 216.

Figure 4:
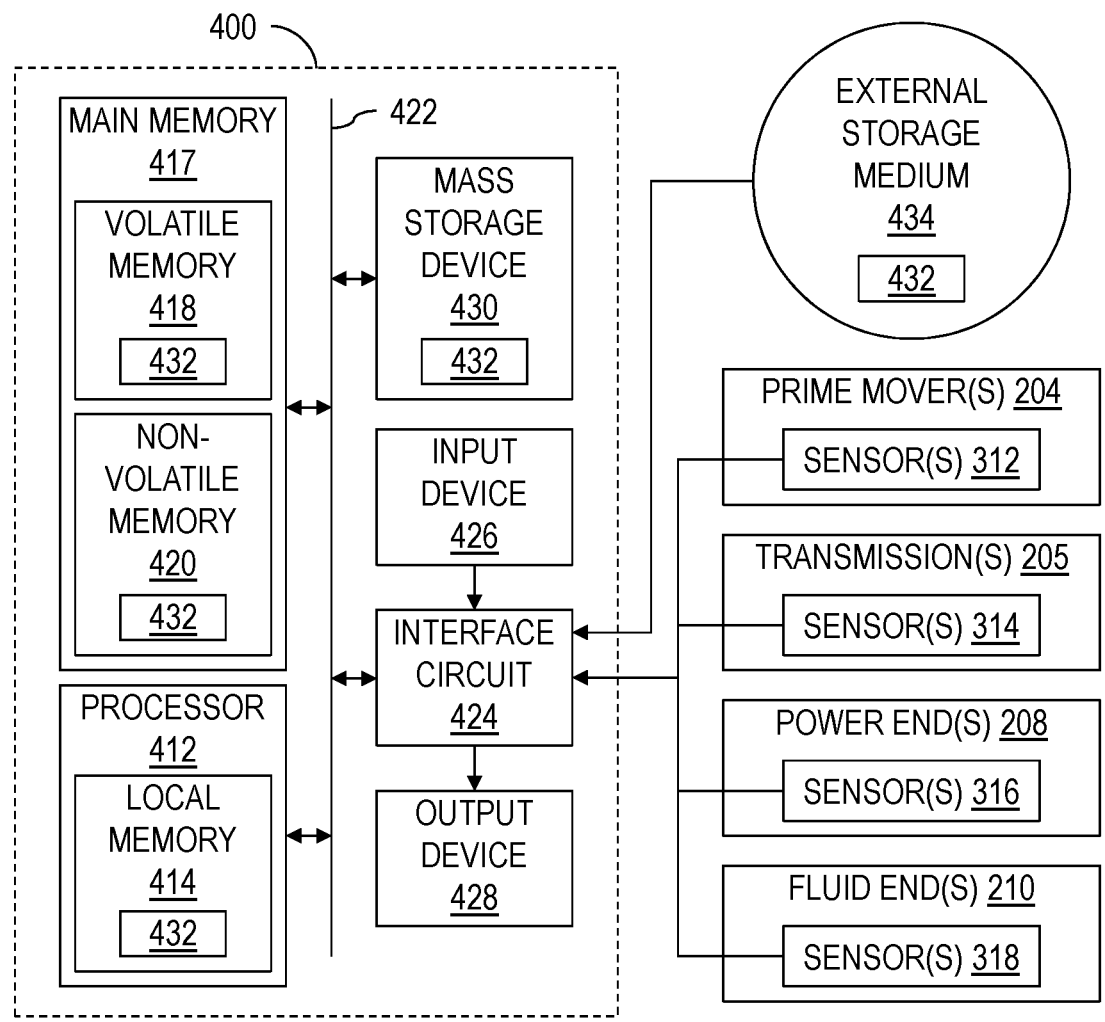
FIG. 4 is a block diagram of an example implementation of apparatus according to one or more aspects of the present disclosure.

FIG. 4 is a block diagram of at least a portion of an example implementation of a processing system 400 operable to assess the health of the pump assemblies 200 according to one or more aspects of the present disclosure. The following description refers to FIGS. 1 and 4, collectively.

The processing system 400 is in wireless or wired communication with the sensors 312, 314, 316, 318 of the pump assemblies 200, whether the processing system 400 is located at or remote from the wellsite 102. At least a portion of the processing system 400 may form at least a portion of the control/power center 133, and may thus also be operable for controlling the mixers 108, 124, the containers 110, 112, 126, the pump units 200, the manifold unit 140, and/or other portions of the wellsite system 100 during pumping and/or other wellsite operations.

One or more instances of the processing system 400 is operable to execute example machine-readable instructions to implement at least a portion of one or more of the example methods and/or processes described herein, and/or to implement at least a portion of one or more of the example apparatus described herein. For example, the mixers 108, 124, the containers 110, 112, 126, the pump units 200, the manifold unit 140, and/or other portions of the wellsite system 100 may each comprise an instance of the processing system 400, although perhaps a subset of the components depicted in the example implementation of the processing system 400 shown in FIG. 4. The processing system 400 may be or comprise, for example, one or more processors, special-purpose computing devices, servers, personal computers, laptop computers, tablet computers, personal digital assistant (PDA) devices, smartphones, internet appliances, and/or other types of computing devices.

The processing system 400 may comprise a processor 412, such as a general- or special-purpose, programmable processor. The processor 412 may comprise a local memory 414, and may execute coded instructions 432 present in the local memory 414 and/or another memory device of the processing system 400. The processor 412 may execute, among other things, machine-readable instructions or programs to implement the example methods and/or processes described herein, as well as other operations utilizing one or more components of the wellsite system 100. The processor 412 may be, comprise, or be implemented by one or a plurality of processors of various types suitable to the local application environment, and may include one or more of general-purpose processors or computers, special-purpose processors or computers, microprocessors, digital signal processors (DSPs), field-programmable gate arrays (FPGAs), application-specific integrated circuits (ASICs), and processors based on a multi-core processor architecture, as non-limiting examples. Of course, other processors from other families are also appropriate.

The processor 412 may be in communication with a main memory 417, such as may include a volatile memory 418 and a non-volatile memory 420, perhaps via a bus 422 and/or other communication means. The volatile memory 418 may be, comprise, or be implemented by random access memory (RAM), static random access memory (SRAM), synchronous dynamic random access memory (SDRAM), dynamic random access memory (DRAM), RAMBUS dynamic random access memory (RDRAM), flash memory, and/or other types of memory devices. The non-volatile memory 420 may be, comprise, or be implemented by read-only memory, flash memory, and/or other types of memory devices. One or more memory controllers (not shown) may control access to the volatile memory 418, the non-volatile memory 420, and/or other portions or components of the main memory 417. The processing system 400 may be operable to store or record (e.g., on the main memory 417) information entered by human operators and/or generated by the sensors of the wellsite system 100, such as the sensors 312, 314, 316, 318 shown in FIGS. 2 and 4.

The processing system 400 may also comprise an interface circuit 424. The interface circuit 424 may be, comprise, or be implemented by various types of standard interfaces, such as an Ethernet interface, a universal serial bus (USB), a third generation input/output (3GIO) interface, a wireless interface, a cellular interface, and/or a satellite interface, among other examples. The interface circuit 424 may also comprise a modem, a network interface card, and/or other communication devices to facilitate exchange of data with external computing devices via one or more networks (e.g., Ethernet connection, digital subscriber line (DSL), telephone line, coaxial cable, cellular telephone system, satellite, etc.). For example, the sensors 312, 314, 316, 318 and/or other components of the wellsite system 100 may be connected with the processing system 400 via the interface circuit 424.

One or more input devices 426 may also be connected to the interface circuit 424. The input devices 426 may permit human operators to enter the coded instructions 432, operational set points, and/or other data into the processing system 400. The input devices 426 may each be, comprise, or be implemented by a keyboard, a mouse, a touchscreen, a track-pad, a trackball, a camera, a voice recognition system, and/or an audio and/or visual recording device, among other examples.

One or more output devices 428 may also be connected to the interface circuit 424. The output devices 428 may each be, comprise, or be implemented by a display devices (e.g., a light-emitting diode (LED) display, a liquid crystal display (LCD), or a cathode ray tube (CRT) display), printers, and/or speakers, among other examples.

The processing system 400 may also connect with or comprise one or more mass storage devices 430 and/or a removable storage medium 434. Each mass storage device 430 and/or removable storage medium 434 may be, comprise, or be implemented by at least a portion (e.g., sector) of a floppy disk drive, a hard disk drive, a compact disk (CD) drive, a digital versatile disk (DVD) drive, and/or a USB and/or other flash drive, among other examples.

The coded instructions 432, the operational set points, and/or other data may be stored in the mass storage device 430, the volatile memory 418, the non-volatile memory 420, the local memory 414, and/or the removable storage medium 434. Thus, components of the processing system 400 may be implemented in accordance with hardware (perhaps implemented in one or more chips including an integrated circuit, such as an ASIC), or may be implemented as software or firmware for execution by the processor 412. In the case of software or firmware, the implementation may be provided as a computer program product including a non-transitory, computer-readable medium embodying computer program code (i.e., software or firmware) thereon for execution by the processor 412.

Figure 5:
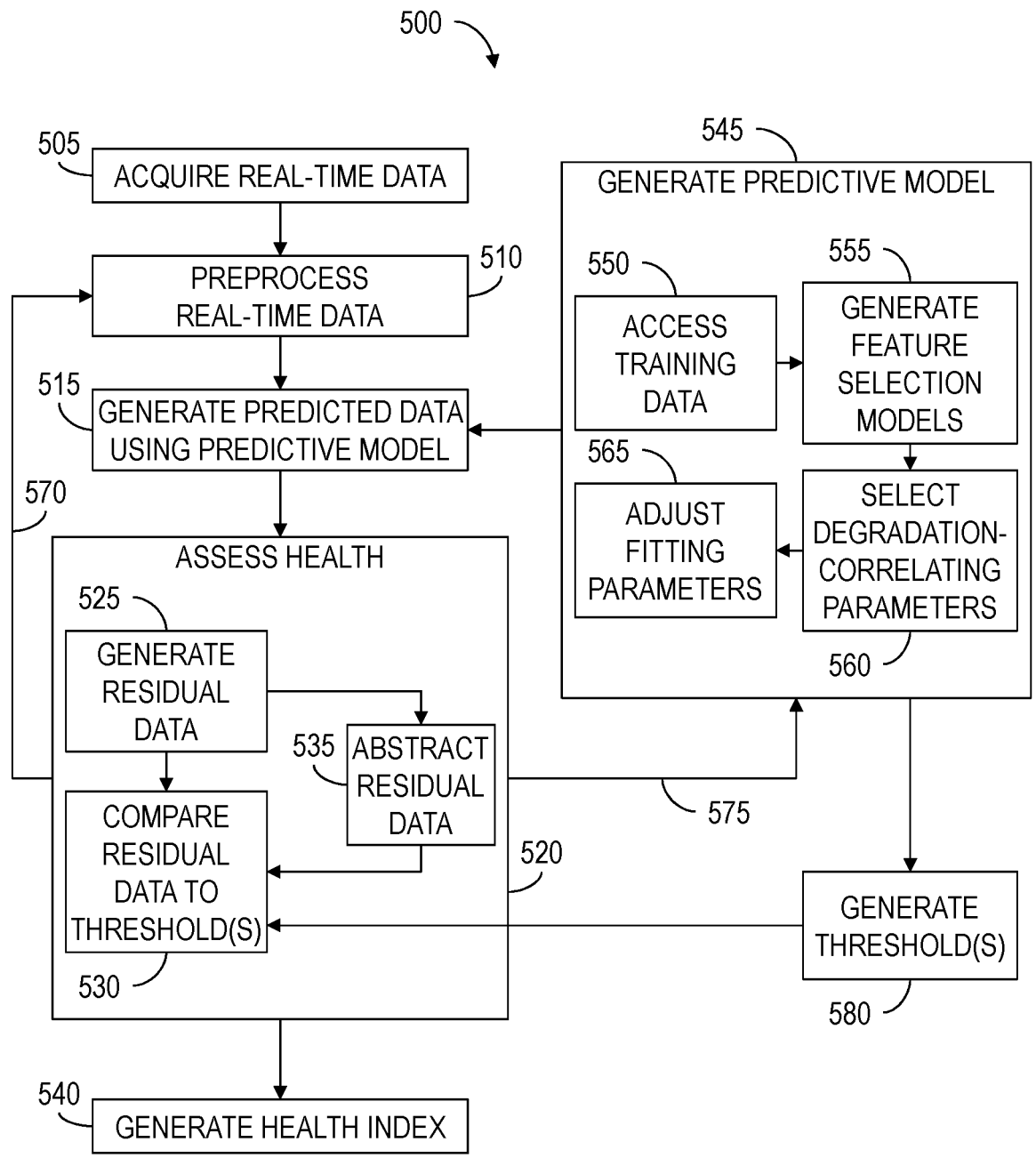
FIG. 5 is a flow-chart diagram of at least a portion of an example implementation of a method according to one or more aspects of the present disclosure.

FIG. 5 is a flow-chart diagram of at least a portion of an example implementation of a method (500) according to one or more aspects of the present disclosure. The method (500) may be utilized to assess the health of a pump assembly 200, and may be performed utilizing at least a portion of one or more implementations of the apparatus shown in one or more of FIGS. 1-4 and/or otherwise within the scope of the present disclosure. For example, the method (500) may be performed and/or caused by operation of the processing system 400 shown in FIG. 4. In this context, the following description of the method (500) shown in FIG. 5 also refers to various features depicted in FIGS. 1-4. However, such reference is solely for the sake of example, in that aspects of the method (500) shown in FIG. 5 are also applicable or readily adaptable for utilization with other apparatus within the scope of the present disclosure but perhaps not explicitly shown in FIGS. 1-4.

The method (500) comprises acquiring (505) real-time data related to one of the pump assemblies 200. The acquired (505) real-time data is indicative of a first operational parameter and a plurality of second operational parameters of the pump assembly 200, as received by the processing system 400 from sensors of the pump assembly 200. For example, the acquired (505) real-time data may include data pertaining to the prime mover 204, such as operating voltage, load percentage, boost pressure, fuel pressure, fuel flow rate, oil pressure, coolant temperature, and/or others, one or more of which may be detected by the one or more sensors 312. The acquired (505) real-time data may also or instead include data pertaining to the transmission 205, such as lockup pressure, converter (not shown) temperature, sump (not shown) temperature, main oil pressure, filter (not shown) in-pressure and/or out-pressure, and/or others, one or more of which may be detected by the one or more sensors 314. The acquired (505) real-time data may also or instead include data pertaining to the power end 208, such as oil pressure, oil temperature, pumping rate, and/or others, one or more of which may be detected by the one or more sensors 316. The acquired (505) real-time data may also or instead include data pertaining to the fluid end 210, such as fluid input (suction) pressure and/or flow rate, fluid output (discharge) pressure and/or flow rate, and/or others, one or more of which may be detected by the one or more sensors 318. The acquired (505) real-time data may also or instead include data pertaining to set points utilized for the current pumping operation, such as a throttle set point of the prime mover 204, a fluid output pressure set point, and/or others, which may be input by human operators via the one or more input devices 426 of the processing system 400.

The acquired (505) real-time data may be associated with different operational modes of the pump assembly 200, such as an idle mode, a testing mode, a calibration (e.g., pressure versus speed) mode, a pumping mode, a flushing mode, and/or others. The acquired (505) real-time data may also include some type of time-based identifier, such a time stamp relative to a general operations clock at the wellsite 102, run-time of a specified pumping and/or other wellsite operation, and/or run-time of a specified instance of the pump assemblies 200 (e.g., spanning the operational life of that pump assembly 200).

The acquired (505) real-time data may then be preprocessed (510). For example, such preprocessing (510) may comprise filtering by selecting data sets from the acquired (505) real-time data that correspond to one or more operational modes of the pump assembly 200. The preprocessing (510) may also or instead comprise filtering by selecting data sets having operational parameter values satisfying predetermined ranges and/or other conditions. Thus, the filtering may select data sets in which values for one or more of the operating voltage, load percentage, boost pressure, fuel pressure, fuel flow rate, oil pressure, coolant temperature, and/or other operational parameters of the prime mover 204, one or more of the lockup pressure, converter temperature, sump temperature, main oil pressure, filter in-pressure and/or out-pressure, and/or other operational parameters of the transmission 205, one or more of the oil pressure, oil temperature, pumping rate, and/or other operational parameters of the power end 208, and/or one or more of the suction pressure and/or flow rate, discharge pressure and/or flow rate, and/or other operational parameters of the fluid end 210, each fall within maximum and minimum thresholds. For example, the filtering may select data sets in which values for the discharge pressure detected by the sensor(s) 318 are between about 2,000 pounds per square inch (PSI) and about 15,000 PSI, values for the pumping rate are between about 0.5 revolutions per minute (RPM) and about 15 RPM, and values for the operating voltage of the prime mover 204 are between about 25 volts (V) and about 30 V. However, other values for the maximum and minimum thresholds are also within the scope of the present disclosure.

The maximum and minimum thresholds utilized for filtering during preprocessing (510) the acquired (505) real-time data may be predetermined or entered in real-time, such as via one or more of the input devices 426 of the processing system 400. The maximum and minimum thresholds utilized for filtering during preprocessing (510) of the acquired (505) real-time data may also vary based on different types of the applicable wellsite equipment device. That is, while the pump assemblies 200 may collectively have substantially similar structure and function, each having a prime mover 204, a transmission 205, a power end 208, and a fluid end 210, these components may vary slightly among the pump assemblies 200. For example, within a fleet of pump assemblies 200, there may be two or more types of prime movers 204, two or more types of transmissions 205, two or more types of power ends 208, and/or two or more types of fluid ends 210. The different types may be attributable to manufacturer and/or model differences, such as where some of the transmissions 205 are products of a first manufacturer and the other transmissions 205 are products of a second manufacturer, or where some of the transmissions 205 are first models of a manufacturer and the other transmissions 205 are second models of the same (or different) manufacturer. In such implementations, the maximum and minimum thresholds utilized for filtering during preprocessing (510) of the acquired (505) real-time data may be specific to the different manufacturer, model, and/or other type-distinguishing characteristic. For example, first maximum and minimum thresholds may be utilized for filtering based on the lockup pressure, sump temperature, and/or other real-time operational parameter data acquired (505) from a first type (e.g., manufacturer and/or model) of transmission 205, and second maximum and minimum thresholds may be utilized for filtering based on the lockup pressure, sump temperature, and/or other real-time operational parameter data acquired (505) from a second type (e.g., manufacturer and/or model) of transmission 205.

The preprocessing (510) may also or instead comprise downsampling. For example, such downsampling may comprise randomly or otherwise selecting a percentage of the acquired (505) data sets. Such downsampling may aid in removing noise from the acquired (505) real-time data, and/or in detecting trends in the preprocessed (510) data.

The preprocessing (510) may also or instead comprise dynamic time warping to temporally align the data relative to each other. The dynamic time warping may be utilized to align known peaks in the data with respect to time, and/or to account for different sampling frequencies existing within the acquired (505) real-time data. The dynamic time warping and/or other aspect of the preprocessing (510) may otherwise provide general formatting to put the data into a form that can be fed into a machine learning algorithm.

As described above, the acquired (505) real-time data is indicative of a first operational parameter and a plurality of second operational parameters of the pump assembly 200. The acquired (505) and/or preprocessed (510) real-time data (hereafter referred to as "the real-time data" for the sake of simplicity) is then utilized to generate (515) predicted data indicative of the first operational parameter. The predicted data indicative of the first operational parameter is generated (515) utilizing a predictive model and the real-time data indicative of each of the second operational parameters. The predictive model relates the first operational parameter to each of the second operational parameters. Thus, generating (515) the predicted data indicative of the first operational parameter utilizes the second operational parameters (from the real-time data) as inputs to the predictive model, which then predicts the first operational parameter.

Different predictive models may be utilized for different components of the pump assembly 200. For example, different predictive models may be utilized for each of the prime mover 204, the transmission 205, the power end 208, and the fluid end 210. Multiple predictive models may also be utilized for each component of the pump assembly 200. For example, with respect to the prime mover 204, a first predictive model may predict oil pressure of the prime mover 204 (which is also being detected by one or more sensors 312) based on the other operational parameters in the real-time data that are related to the prime mover 204 (or perhaps based on each of the operational parameters available in the real-time data, not just those related to the prime mover 204), while a second predictive model may predict fuel pressure of the prime mover 204 (which is also being detected by one or more sensors 312) based on the other operational parameters in the real-time data. Similarly, with respect to the transmission 205, a first predictive model may predict sump temperature of the transmission 205 (which is also being detected by one or more sensors 314) based on the other operational parameters in the real-time data, and a second predictive model may predict filter in-pressure of the transmission 205 (which is also being detected by one or more sensors 314) based on the other operational parameters in the real-time data. With respect to the power end 208, a first predictive model may predict oil pressure of the power end 208 (which is also being detected by one or more sensors 316) based on the other operational parameters in the real-time data, and a second predictive model may predict oil temperature of the power end 208 (which is also being detected by one or more sensors 316) based on the other operational parameters in the real-time data. With respect to the fluid end 210, a first predictive model may predict discharge pressure of the fluid end 210 (which is also being detected by one or more sensors 318) based on the other operational parameters in the real-time data, while a second predictive model may predict suction pressure of the fluid end 210 (which is also being detected by one or more sensors 318) based on the other operational parameters in the real-time data.

In the previous paragraph, the examples of the "first" operational parameters generated (515) using the corresponding predictive models include oil pressure and fuel pressure of the prime mover 204, sump temperature and filter in-pressure of the transmission 205, oil pressure and oil temperature of the power end 208, and discharge pressure and suction pressure of the fluid end 210. However, these are merely examples, and other ones of the operational parameters available in the real-time data may also be predicted as the "first" operational parameters using the predictive models and the remaining ("second") operational parameters available in the real-time data.

Moreover, the first and second operational parameters may also include mathematic relations between the operational parameters available in the real-time data. For example, continuing with the above-described examples of the first and second predictive models related to the transmission 205, a third predictive model related to the transmission 205 may predict the difference between the filter in-pressure of the transmission 205 and the filter out-pressure of the transmission, based on the other operational parameters in the real-time data. The different predictive models related to each component of the pump assembly 200 may also be utilized in different combinations based on the above-described types of each component. For example, a first type (e.g., manufacturer and/or model) of transmission 205 may utilize the first and second predictive models, and a second type (e.g., manufacturer and/or model) of transmission 205 may utilize the first, second, and third predictive models.

After the "first" operational parameters are predicted (515), the health of the pump assembly 200 is assessed (520) utilizing the predicted (515) data indicative of the first operational parameter and the real-time data indicative of the first operational parameter. The health assessment (520) comprises generating (525) residual data. The generated (525) residual data comprises, for example, quantitative differences between temporally or otherwise related ones of the predicted (515) and real-time data indicative of the first operational parameter. For example, with respect to the fluid end 210, if the utilized predictive model predicts (515) the discharge pressure, then generating (525) the residual data comprises subtracting the predicted (515) discharge pressure from the corresponding acquired (505) real-time discharge pressure.

The generated (525) residual data permit a visualization of how the predictive model error is changing in the time domain. That is, the generated (525) residual data of a healthy pump assembly 200 should have a mean that is close to zero, and as the pump assembly 200 degrades, the physical dynamics of the pumping system changes. The changing dynamics result in a shift in the input-output relationship compared to that predicted by the predictive model(s). This shift causes the generated (525) residual data to increase as the pump assembly 200 degrades, thereby providing a metric by which degradation can be monitored.

Thus, the health assessment (520) may also comprise comparing (530) the residual data to one or more predetermined thresholds corresponding to known level(s) of degradation of other pump assemblies 200 that are substantially similar in structure and function to the pump assembly 200 undergoing the health assessment (520). For example, the generated (525) residual data may be compared (530) to first and second predetermined thresholds, wherein the first predetermined threshold corresponds to a first predetermined value related to operational failure of one or more of the other pump assemblies, and the second predetermined threshold is less than the first predetermined threshold and corresponds to a reduced operational effectiveness of one or more of the other pump assemblies. Accordingly, with respect to the fluid end 210, if the utilized predictive model predicts (515) the discharge pressure, then the generated (525) residual data pertaining to discharge pressure may be compared (530) to a value that corresponds to or is otherwise related to actual or imminent operational failure of one or more of the other pump assemblies, such as a discharge pressure residual of about 5,000 PSI. Continuing with this example, the generated (525) residual data for discharge pressure may also be compared (530) to another value that corresponds to or is otherwise related to actual reduced operational effectiveness of one or more of the other pump assemblies, such as a discharge pressure residual of about 2,000 PSI. If the generated (525) residual data for discharge pressure exceeds the lower 2,000 PSI threshold, then the pump assembly 200 undergoing the health assessment (520) may be deemed to have degraded a moderate amount and thus has diminished health, and if the generated (525) residual data for discharge pressure exceeds the higher 5,000 PSI threshold, then the pump assembly 200 may be deemed to have degraded a severe amount and thus has very poor health, perhaps indicating that failure is imminent and/or that maintenance and/or replacement should be performed as soon as possible. The predetermined thresholds are determined using the training data described below, and can be updated as more training data is collected.

The health assessment (520) may also comprise abstracting (535) the residual data, in which case the comparison (530) to the predetermined thresholds may utilize the generated (525) residual data, the abstracted (535) residual data, or some combination thereof. Abstracting (535) the residual data may comprise smoothing the residual data, such as by a moving standard deviation, moving/weighted average, moving minimum, and/or other statistical processes. Even with the above-described preprocessing (510), the generated (525) residual data can be noisy, and the abstracting (535) may aid in denoising and identifying trends in the residual data. For example, the abstraction (535) may be sufficient to render the residual data substantially monotonic, such that trends may be more identified.

A health index may also be generated (540) based on the health assessment (520), such as may be displayed on one of the output devices 428 of the processing system 410. That is, the generated (525), abstracted (535), and compared (530) residual data may have different magnitudes of range depending on the particular operational parameter that is predicted (515) by the predictive models. For example, oil pressure residual data for the power end 208 may range from 0-10 PSI, whereas the discharge pressure residual data for the fluid end 210 may range from 0-1000 PSI. Generating (540) the health index may scale the residual data for each predicted operational parameter to a common, unitless scale, such as from 0-100. In such implementations, the predetermined threshold utilized for comparison (530) to moderate degradation may correspond to a health index of 50 on a scale of 100, and the predetermined threshold utilized for comparison (530) to severe degradation may correspond to a health index of 70, although other values may also be utilized within the scope of the present disclosure. In implementations in which the health index is displayed on an output device, the health index may be color-coded, such as green for low to moderate degradation, yellow for moderate to severe degradation, and red for severe degradation.

The method (500) may also comprise generating (545) the predictive model that is utilized to generate (515) the predicted data indicative of the first operational parameter. For example, generating (545) the predictive model may comprise accessing (550) preexisting training data indicative of each of the available operational parameters of other pump assemblies that are substantially similar in structure and function to the pump assembly 200 undergoing the health assessment (520). The accessed (550) preexisting training data may be limited to data obtained when the other pump assemblies (that are substantially similar in structure and function to the pump assembly 200 undergoing the health assessment) were new or otherwise substantially healthy. Accordingly, the generated (525) residual data may exhibit mean values that are near zero when the pump assembly 200 undergoing the health assessment (520) is substantially new, recently maintained, and/or otherwise substantially healthy, but then deviate from what was considered healthy data as the pump assembly 200 degrades.

The first and second operational parameters utilized to generate (515) the predicted data may be selected from the available operational parameters based on correlation between operational degradation of the previously analyzed pump assemblies and ones of the operational parameters available in the training data. Generating (545) the predictive model may then include adjusting (565) fitting parameters of the model (e.g., iteratively) to exploit a correlation between each of the first and second operational parameters in the preexisting training data to optimize prediction performance of the model.

For example, the preexisting training data may be utilized to generate (555) multiple feature-selection models, each predicting a corresponding one of the available operational parameters utilizing other ones of the available operational parameters. Thus, if there are twenty operational parameters available in the training data, then twenty feature-selection models may be generated (555). The first and second operational parameters may then be selected (560) based on the correlation exhibited by the feature-selection models. That is, the one (or more) of the generated (555) feature-selection models that exhibits the closest correlation to degradation may be selected (560). Selecting (560) the first and second operational parameters may also be based on physical assumptions based on human observations of prior operations in the field and/or prior maintenance operations.

Selecting (560) the first and second operational parameters based on correlation of the generated (555) feature-selection models, however, may include first selecting the first operational parameters (the operational parameter for which predicted data will be generated (515)), and then selecting which of the remaining operational parameters will be used for model inputs. Using each available sensor to model the predicted (515) outputs is an option. However, it may be the case that just a few of the sensor readings contribute to the majority of the output variability. By removing data inputs that are unrelated and/or have small correlations to the desired output, modeling can be performed more quickly and more efficiently, and with less noise that may hinder the results of the analysis.

Moreover, as similarly described above, two or more operational parameters may be combined to create new parameters that may improve results. For example, in certain electrical systems, the input power can be highly correlated to the system's degradation rate. If this is the case, then the input current and input voltage can be multiplied together to create an operational parameter for input power that may be used to improve the modeling performance.

However, other processes may also or instead be utilized for generating (545) the predictive model. Such processes may include statistical and/or physics-based tools and methods able to take in the selected (560) first operational parameters and then provide a prediction (515) for the output. Physics-based modeling may utilize traditional physics equations derived from first principles to describe the behavior of a given system, and may provide insight into the physical behavior of the system and how that system is failing. However, in most complex systems with high dimensional data, first principle models have not been formulated, and determining the physical relationship between a given output and a large number of input parameters may not be a feasible task, given the value of the asset.

In such scenarios, data driven, machine learning, and/or other statistical modeling techniques can be used with the training data to train a model by feeding the algorithm data and then iteratively adjusting a set of model parameters in order to minimize the model error as compared to the training data. Such methods may improve performance by finding the correlation between the input data and a given output and then use the correlation strength to weigh the input parameters. Generating (545) the models may also include normalizing the training data along multiple dimensions to improve model performance.

As described above, the generated (525) residual data of a healthy pump assembly 200 should have a mean that is close to zero. If this is not the case, the model may be remodeled using more relevant training data, or the fitting parameters of the model may be readjusted. When deploying a new model, a few iterations between the model generating (545) and the residual analysis health assessment (520) may be performed to assure that the model is tuned according to the acquired (505) real-time data. For example, the method (500) may also comprise adjusting the preprocessing (510) performed on the acquired (505) real-time data based on the generated (525) and/or abstracted (535) residual data, as depicted in FIG. 5 by arrow 570. The method (500) may also comprise adjusting the generation (545) of the predictive model based on the generated (525) and/or abstracted (535) residual data, as depicted in FIG. 5 by arrow 575. Such adjustment (575) may comprise repeating one or more of the feature-selection model generation (555), the degradation-correlating parameter selection (560), and/or the fitting parameter adjustment (565), among other examples.

The method (500) may also comprise generating (580) the predetermined thresholds utilized for comparison (530) with the generated (525) and/or abstracted (535) residual data. The generated (580) thresholds may correspond to particular amounts of operating time remaining before a failure occurs. For example, if the training data contains a failure event, the predictive model(s) can be utilized to determine the magnitude of the model residuals that correspond with a predetermined amount of operating time before the failure was observed (such as about 10 hours or some other lead time appropriate for field engineers to prepare for maintenance and/or replacement of the pump assembly 200), and the determined magnitude may be used as a warning threshold. This would indicate the amount of operating time left available before a failure is expected. However, other approaches to generating (580) the predetermined thresholds, other than this fixed-point example, are also within the scope of the present disclosure. Moving thresholds may also be generated (580), such as to account for changing environmental or operating conditions. Probabilistic thresholds may also be used where the threshold is not a singular point but a distribution of values that correspond to a probability of reaching a certain level of degradation. Other thresholds can be set up based on the derivative of the model residuals with respect to time, including in applications in which the change in degradation with respect to time is very small towards the beginning of life and then rapidly becomes steep as failure approaches. Generating (580) the predetermined thresholds may also or instead utilize a receiver operating characteristic (ROC) curve, which may aid in visualizing how the ratio between actual detections and missed detections changes for different threshold values, thus permitting optimization of the predetermined thresholds.

Figure 6:
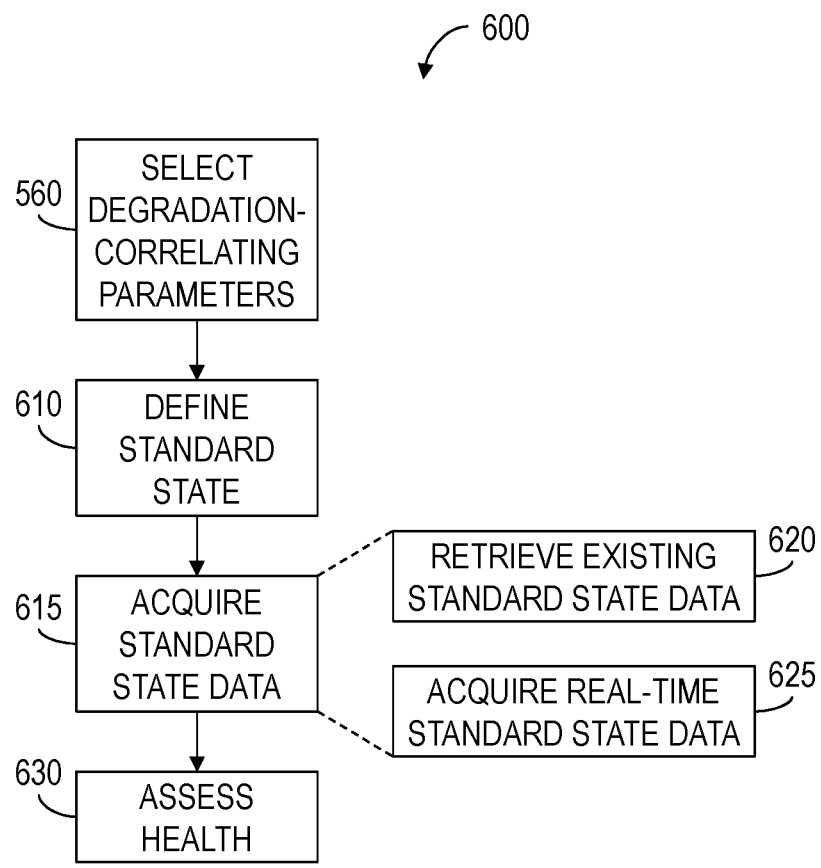
FIG. 6 is a flow-chart diagram of at least a portion of an example implementation of a method according to one or more aspects of the present disclosure.

FIG. 6 is a flow-chart diagram of at least a portion of an example implementation of a method (600) according to one or more aspects of the present disclosure. The method (600)

may be utilized to assess the health of a pump assembly 200, and may be performed utilizing at least a portion of one or more implementations of the apparatus shown in one or more of FIGS. 1-4 and/or otherwise within the scope of the present disclosure. For example, the method (600) may be performed and/or caused by operation of the processing system 400 shown in FIG. 4. In this context, the following description of the method (600) shown in FIG. 6 also refers to various features depicted in FIGS. 1-4. However, such reference is solely for the sake of example, in that aspects of the method (600) shown in FIG. 6 are also applicable or readily adaptable for utilization with other apparatus within the scope of the present disclosure but perhaps not explicitly shown in FIGS. 1-4.

The method (600) comprises selecting (560) degradation-correlating parameters available for the pump assembly 200 undergoing assessment, as described above. The selected (560) degradation-correlating parameters are then utilized when defining (610) a standard state to be utilized to examine the pump assembly 200 based on the selected (560) degradation-correlating parameters. The standard state is an operational condition that most instances of the pump assemblies 200 will go through during most wellsite operations, perhaps at least once per day, week, or month. However, the standard state may also be a set of operating conditions at which each pump assembly 200 is forced to operate at minimum intervals, such as least once per day, week, or month, such as part of scheduled maintenance.

For example, to assess the health of the prime movers 204, the transmissions 205, the power ends 208, and/or the fluid ends 210, each pump assembly 200 may be operated once a week to generate a discharge pressure (as detected by one or more sensors 318) of about 10,000 PSI for about 5 minutes, although perhaps after at least about 30 minutes of operation with a discharge pressure of at least about 9,000 PSI or some other "warm-up" period. However, these are example values and parameters, which may be changed depending on the components of the pump assemblies 200 and the operational parameters being measured. The standard state may also specify more than one operational parameter that is maintained within defined (610) ranges, such as discharge pressure and another of the operational parameters described above and detected by sensors of the pump assemblies 200 (e.g., one or more of the sensors 312, 314, 316, and/or 318).

The defined (610) standard state may pertain to normal operation of the pump assembly 200, or greater than normal operation of the pump assembly 200. For example, a defined (610) standard state related to normal operation may be one that the pump assembly 200 regularly goes through in normal operations. An analogous example might be an automobile with cruise control set at 55 miles per hour (MPH) on a flat, straight road for 10 minutes. Thus, with respect to a pump assembly 200 in the context of the present disclosure, a standard state related to normal operation may be "full power" operation, such as sustaining a discharge pressure of about 9,200 PSI for 2 minutes, perhaps after at least 30 minutes of operation with a discharge pressure above at least 9,000 PSI. A defined (610) standard state related to greater than normal operation may be one that the pump assembly 200 less commonly goes through in normal operations, but that is more stressful to the pump assembly 200. Thus, continuing with the analogous automobile example, a greater than normal standard state may be with cruise control set at 80 MPH on a flat, straight road for 10 minutes. Thus, with respect to a pump assembly 200 in the context of the present disclosure, a standard state related to greater than normal operation may be "maximum power" operation, such as sustaining a discharge pressure of about 10,000 PSI for 2 minutes, perhaps after at least 30 minutes of operation with a discharge pressure above at least 9,700 PSI.

Defining (610) the standard state may include defining tolerances in the defined conditions. For example, the defined tolerances may be a small percentage (e.g., between 1% and 5%) of the defined standard state condition. Continuing with the automobile normal operation example, the defined tolerances may permit a speed ranging between 54 MPH and 56 MPH, on a road that is within 4 degrees of horizontal. Similarly, the example standard state of the pump assembly 200 related to normal operation may permit a discharge pressure ranging between 9,150 PSI and 9,250 PSI.

The defined (610) standard state may also include conditions for environmental and other factors not directly associated with the pump assembly 200 but that may also affect performance of the pump assembly 200. Examples of such factors may include temperature, humidity, elevation, and/or other characteristics of the wellsite and ambient environment, as well as density, viscosity, homogeneity, composition, and/or other characteristics of the fluid being pumped by the pump assembly 200 during the standard state operation.

It is also noted that, to insure the collection of standard state data at various points during the operational life of the pump assemblies 200, each pump assembly 200 may be operated in the standard state as a part of regular operations and/or maintenance. For example, it may be mandated that each pump assembly 200 is operated in the standard state at least once during a predetermined time period, such as at least once during each 100 hours of operations.

The defined (610) standard state is then utilized to acquire (615) standard state data pertaining to the pump assembly 200 undergoing the health assessment. For example, acquiring (615) the standard state data may comprise retrieving (620) existing operational data obtained from one or more of the sensors of the pump assembly 200 during previous operation of the pump assembly 200 at the defined (610) standard state conditions. Such retrieval (620) may include multiple instances of the pump assembly 200 being operated at the defined (610) standard state conditions. Acquiring (615) the standard state data may also or instead comprise acquiring (625) real-time data while the pump assembly 200 is operating at the defined (610) standard state conditions. In either case, the acquired (615) standard state data may be obtained during a portion of actual (e.g., commercial) wellsite operations in which the pump assembly 200 is operated at the defined (610) standard state conditions, or during a forced health assessment procedure separate from the actual wellsite operations.

The acquired (615) standard state data is then utilized to assess (630) health of the pump assembly 200. For example, the selected (560) degradation-correlating parameters in the acquired (615) standard state data may be plotted as a function of time, such as from when the pump assembly 200 was new (and/or most recently maintained) to when a failure event occurred. The selected (560) degradation-correlating parameters in the acquired (615) standard state data will thus exhibit a trend over time (e.g., at a large time scale, such as several months) while the pump assembly 200 is operated at the defined (610) standard state. The health assessment (630) may include processing the selected (560) degradation-correlating parameters in the acquired (615) standard state data, such as to utilize the mean of each selected (560) degradation-correlating parameters for the health assessment (630).

The health assessment (630) may otherwise have one or more aspects in common with the health assessment (520) shown in FIG. 5 and described above. For example, the acquired (615) standard state data may include standard state data obtained when the pump assembly 200 (or similar pump assemblies) was new and/or most recently maintained, which may then be compared to subsequently acquired (e.g., real-time) standard state data to generate residual data similar to that described above with respect to FIG. 5. Such residual data may then be compared to predetermined thresholds, such as those also described above with respect to FIG. 5. Such comparison may then be utilized to generate (540) a health index as also described above.

In view of the entirety of the present disclosure, including the figures and the claims, a person having ordinary skill in the art will readily recognize that the present disclosure introduces a method comprising operating a processing system comprising a processor and a memory including computer program code, wherein operating the processing system comprises: (A) generating predicted data indicative of a first operational parameter of a pump assembly, wherein generating the predicted data utilizes: (1) a model relating the first operational parameter to each of a plurality of second operational parameters of the pump assembly; and (2) real-time data indicative of each of the second operational parameters; and (B) assessing health of the pump assembly based on: (1) the predicted data indicative of the first operational parameter; and (2) real-time data indicative of the first operational parameter.

The method may further comprise generating a health index of the pump assembly based on a relationship between the predicted and real-time data indicative of the first operational parameter. In such implementations, among others within the scope of the present disclosure, the processing system may further comprise a display, and operating the processing system may further comprise displaying the generated health index on the display.

The health assessment may comprise: generating residual data comprising quantitative differences between temporally-related ones of the predicted and real-time data indicative of the first operational parameter; and comparing the residual data to a predetermined threshold. In such implementations, among others within the scope of the present disclosure, operating the processing system may further comprise adjusting the model based on the residual data. The pump assembly may be a first one of a plurality of pump assemblies each having substantially similar structure, and the predetermined threshold may correspond to a known level of degradation of one or more second ones of the pump assemblies. For example, comparing the residual data to a predetermined threshold may comprise comparing the residual data to a first predetermined threshold and a second predetermined threshold, the first predetermined threshold may correspond to a first predetermined value related to operational failure of one or more of the second ones of the pump assemblies, and the second predetermined threshold may be less than the first predetermined threshold and correspond to reduced operational effectiveness of one or more of the second ones of the pump assemblies.

The health assessment may further comprise abstracting the residual data, and comparing the residual data to the predetermined threshold may comprise comparing the abstracted residual data to the predetermined threshold. Abstracting the residual data may comprise smoothing the residual data. Abstracting the residual data may render the residual data substantially monotonic.

Operating the processing system may further comprise filtering the real-time data, and generating the predicted data may utilize the filtered real-time data. Filtering the real-time data may include filtering based on operational modes of the pump assembly.

The processing system, the processor, and the memory may be a first processing system, a first processor, and a first memory, respectively, wherein the first processing system is separate and discrete from a second processing system comprising a second processor and a second memory, and the method may further comprise operating one of the first and second processing systems to generate the model. For example, the pump assembly may be a first pump assembly, a plurality of pump assemblies each having substantially similar structure may comprise the first pump assembly and a plurality of second pump assemblies, generating the model may utilize preexisting training data indicative of each of the first and second operational parameters of at least each of the second pump assemblies, and generating the model may comprise iteratively adjusting a plurality of fitting parameters of the model to exploit a correlation between each of the first and second operational parameters in the preexisting training data to optimize prediction performance of the model. The preexisting training data utilized to generate the model may be indicative of each of the first and second operational parameters of each of the first and second pump assemblies. Generating the model may also or instead comprise: accessing preexisting training data indicative of each of a plurality of available operational parameters of at least each of the second pump assemblies; and selecting the first and second operational parameters from the plurality of available operational parameters based on correlation between operational degradation of ones of at least the second pump assemblies and ones of the plurality of available operational parameters. Selecting the first and second operational parameters may comprise: generating a plurality of feature-selection models each predicting a corresponding one of the plurality of available operational parameters utilizing other ones of the plurality of available operational parameters; and selecting the first and second operational parameters based on correlation of each of the plurality of feature-selection models. Selecting the first and second operational parameters may be further based on physical assumptions based on human observations of prior operations utilizing ones of the plurality of pump assemblies.

The present disclosure also introduces a method comprising operating a processing system comprising a processor and a memory including computer program code, wherein operating the processing system comprises, with respect to each of a plurality of pump assemblies: (A) generating predicted data indicative of a first operational parameter of that pump assembly, wherein generating the predicted data utilizes: (1) a single model applicable to each of the plurality of pump assemblies and relating the first operational parameter to each of a plurality of second operational parameters of the pump assemblies; and (2) real-time data obtained from, and indicative of each of the second operational parameters of, that pump assembly; and (B) assessing health of that pump assembly based on: (1) the predicted data generated with respect to that pump assembly; and (2) real-time data obtained from, and indicative of the first operational parameter of, that pump assembly.

Operating the processing system may further comprise generating a health index of each pump assembly based on: the predicted data generated with respect to that pump assembly; and the real-time data obtained from, and indicative of the first operational parameter of, that pump assembly.

The present disclosure also introduces an apparatus comprising a processing system comprising a processor and a memory including computer program code, wherein the processing system is operable to: (A) generate predicted data indicative of a first operational parameter of a pump assembly, wherein the processing system is operable to generate the predicted data utilizing: (1) a model implemented in the computer program code and relating the first operational parameter to each of a plurality of second operational parameters of the pump assembly; and (2) real-time data indicative of each of the second operational parameters; and (B) assess health of the pump assembly based on: (1) the predicted data indicative of the first operational parameter; and (2) real-time data indicative of the first operational parameter.

The processing system may be further operable to generate a health index of the pump assembly based on a relationship between the predicted and real-time data indicative of the first operational parameter. The processing system may further comprise a display, and the processing system may be further operable to display the generated health index on the display.

The health assessment may comprise: generating residual data comprising quantitative differences between temporally-related ones of the predicted and real-time data indicative of the first operational parameter; and comparing the residual data to a predetermined threshold. The pump assembly may be a first one of a plurality of pump assemblies each having substantially similar structure, and the predetermined threshold may correspond to a known level of degradation of one or more second ones of the pump assemblies. For example, comparing the residual data to a predetermined threshold may comprise comparing the residual data to a first predetermined threshold and a second predetermined threshold, the first predetermined threshold may correspond to a first predetermined value related to operational failure of one or more of the second ones of the pump assemblies, and the second predetermined threshold may be less than the first predetermined threshold and may correspond to reduced operational effectiveness of one or more of the second ones of the pump assemblies. The health assessment may further comprise abstracting the residual data, and comparing the residual data to the predetermined threshold may comprise comparing the abstracted residual data to the predetermined threshold.

The present disclosure also introduces a method comprising operating a processing system comprising a processor and a memory including computer program code, wherein operating the processing system comprises: selecting a plurality of degradation-correlating parameters available for a pump assembly; utilizing the degradation-correlating parameters when defining a standard state of operation of the pump assembly; acquiring standard state data pertaining to the pump assembly; and utilizing the standard state data to assess health of the pump assembly.

The standard state may be an operational condition that the pump assembly goes through during a majority of wellsite operations in which the pump assembly is utilized. The standard state may also or instead be an operating condition at which the pump assembly is forced to operate at minimum intervals.

Acquiring the standard state data may comprise retrieving preexisting operational data obtained from one or more of the sensors of the pump assembly during previous operation of the pump assembly at the standard state. Acquiring the standard state data may also or instead comprise acquiring real-time data while the pump assembly is operating at the standard state.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the scope of the present disclosure, and that they may make various changes, substitutions and alterations herein without departing from the spirit and scope of the present disclosure.

The Abstract at the end of this disclosure is provided to comply with 37 C.F.R. § 1.72(b) to allow the reader to quickly ascertain the nature of the technical disclosure. It is submitted with the understanding that it will not be used to interpret or limit the scope or meaning of the claims.

What is claimed is:

1. A method comprising:
    operating a processing system comprising a processor and a memory including computer program code, wherein operating the processing system comprises:
        operating a wellsite surface equipment pump assembly, wherein the pump assembly comprises a plurality of components and is disposed at a wellsite surface from which a wellbore originates and extends below to a subterranean formation, and wherein the pump assembly components comprise a prime mover, a transmission, a fluid end, and a power end;
        generating predicted data indicative of a first operational parameter of at least one component of the pump assembly, wherein generating the predicted data utilizes:
            a model relating the first operational parameter to each of a plurality of second operational parameters of the components of the pump assembly; and
            real-time operational data indicative of each of the second operational parameters; and
        assessing health of at least one of the components of the pump assembly based on:
            the predicted data indicative of the first operational parameter; and
            real-time operational data indicative of the first operational parameter; and
        generating a health index of at least one of the components of the pump assembly based on a relationship between the predicted and real-time operational data indicative of the first operational parameter.

2. The method of claim 1 wherein the health assessment comprises:
    generating residual data comprising quantitative differences between temporally-related ones of the predicted and real-time data indicative of the first operational parameter; and
    comparing the residual data to a predetermined threshold.

3. The method of claim 2 wherein the pump assembly is a first one of a plurality of pump assemblies each having similar pump assembly components and disposed at the wellsite surface, and wherein the predetermined threshold corresponds to a known level of degradation of one or more second ones of the pump assemblies.

4. The method of claim 3 wherein:
comparing the residual data to a predetermined threshold comprises comparing the residual data to a first predetermined threshold and a second predetermined threshold;
the first predetermined threshold corresponds to a first predetermined value related to operational failure of one or more of the second ones of the pump assemblies; and
the second predetermined threshold is less than the first predetermined threshold and corresponds to reduced operational effectiveness of one or more of the second ones of the pump assemblies.

5. The method of claim 1 wherein the processing system, the processor, and the memory are a first processing system, a first processor, and a first memory, respectively, wherein the first processing system is separate and discrete from a second processing system comprising a second processor and a second memory, and wherein the method further comprises operating one of the first and second processing systems to generate the model.

6. The method of claim 5 wherein:
the pump assembly is a first pump assembly;
a plurality of pump assemblies, each having similar pump assembly components, comprises the first pump assembly and a plurality of second pump assemblies;
generating the model utilizes preexisting training data indicative of each of the first and second operational parameters of at least each of the second pump assemblies; and
generating the model comprises iteratively adjusting a plurality of fitting parameters of the model to exploit a correlation between each of the first and second operational parameters in the preexisting training data to optimize prediction performance of the model.

7. The method of claim 6 wherein the preexisting training data utilized to generate the model is indicative of each of the first and second operational parameters of each of the first and second pump assemblies.

8. The method of claim 5 wherein:
the pump assembly is a first pump assembly;
a plurality of pump assemblies, each having similar structure and function, comprises the first pump assembly and a plurality of second pump assemblies;
generating the model comprises:
    accessing preexisting training data indicative of each of a plurality of available operational parameters of at least each of the second pump assemblies; and
    selecting the first and second operational parameters from the plurality of available operational parameters based on correlation between operational degradation of ones of at least the second pump assemblies and ones of the plurality of available operational parameters.

9. The method of claim 8 wherein selecting the first and second operational parameters comprises:
generating a plurality of feature-selection models each predicting a corresponding one of the plurality of available operational parameters utilizing other ones of the plurality of available operational parameters; and
selecting the first and second operational parameters based on correlation of each of the plurality of feature-selection models.

10. An apparatus comprising:
a processing system comprising a processor and a memory including computer program code, wherein the processing system:
    gathers data from a plurality of operating components of at least one wellsite surface equipment pump assembly, wherein the wellsite surface equipment pump assembly components comprise at least a prime mover, a transmission, a fluid end, and a power end, and wherein the wellsite surface equipment pump assembly and each of its operating components are disposed at a wellsite surface from which a wellbore originates and extends below to a subterranean formation;
    generates predicted data indicative of a first operational parameter of the plurality of operating components of the at least one wellsite surface equipment pump assembly, wherein the processing system generates the predicted data utilizing:
        a model implemented in the computer program code and relating the first operational parameter to each of a plurality of second operational parameters of the wellsite surface equipment pump assembly; and
        real-time data indicative of each of the second operational parameters; and
    assesses, without human interaction, health of at least one of the operating components of the wellsite surface equipment pump assembly based on:
        the predicted data indicative of the first operational parameter; and
        real-time data indicative of the first operational parameter.

11. The apparatus of claim 10 wherein the processing system assesses the health by:
generating residual data comprising quantitative differences between temporally-related ones of the predicted and real-time data indicative of the first operational parameter; and
comparing the residual data to a predetermined threshold.

12. The apparatus of claim 11 wherein the pump assembly is a first one of a plurality of pump assemblies each having similar pump assembly components, and wherein the predetermined threshold corresponds to a known level of degradation of one or more second ones of the pump assemblies.

13. The apparatus of claim 12 wherein:
comparing the residual data to a predetermined threshold comprises comparing the residual data to a first predetermined threshold and a second predetermined threshold;
the first predetermined threshold corresponds to a first predetermined value related to operational failure of one or more of the second ones of the pump assemblies; and
the second predetermined threshold is less than the first predetermined threshold and corresponds to reduced operational effectiveness of one or more of the second ones of the pump assemblies.

14. A method comprising:
operating a wellsite surface equipment pump assembly, wherein the pump assembly comprises a plurality of components and is disposed at a wellsite surface from which a wellbore originates and extends below to a subterranean formation;
operating a processing system comprising a processor and a memory including computer program code, wherein operating the processing system comprises:
    selecting a plurality of degradation-correlating parameters available for at least one component of the pump assembly;

utilizing the degradation-correlating parameters when defining a standard state of operation for the components of the pump assembly;

acquiring standard state data pertaining to the components of the pump assembly by acquiring real-time data while the pump assembly is operating at the standard state; and utilizing the standard state data to assess health of the components of the pump assembly.

15. The method of claim 14 wherein the standard state is an operational condition that the pump assembly goes through during a majority of wellsite operations in which the pump assembly is utilized.

16. The method of claim 14 wherein the standard state is an operating condition at which the pump assembly is forced to operate at minimum intervals.

17. The method of claim 14 wherein acquiring the standard state data comprises retrieving preexisting operational data obtained from one or more of the sensors of the pump assembly during previous operation of the pump assembly at the standard state.

18. The method of claim 1 wherein the pump assembly components comprise a prime mover, a transmission, a fluid end, and a power end.

19. The method of claim 14 wherein the pump assembly components comprise a prime mover, a transmission, a fluid end, and a power end.

20. The method of claim 1 wherein generating the health index further comprises generating the health index based on generated, abstracted, and compared residual operational data.

* * * * *